United States Patent
Tajic (10) Patent No.: US 9,985,194 B1
(45) Date of Patent: May 29, 2018

(54) SPURIOUS MODE SUPPRESSION IN BULK ACOUSTIC WAVE RESONATOR

(71) Applicant: TriQuint Semiconductor, Inc., Hillsboro, OR (US)

(72) Inventor: Alireza Tajic, Winter Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 328 days.

(21) Appl. No.: 14/711,679

(22) Filed: May 13, 2015

(51) Int. Cl.
*H03H 9/17* (2006.01)
*H01L 41/047* (2006.01)

(52) U.S. Cl.
CPC .............................. *H01L 41/0477* (2013.01)

(58) Field of Classification Search
CPC ... H01L 41/0477; H01L 41/0478; H03H 3/02; H03H 9/02007; B06B 1/0614
USPC .................. 310/320, 321, 364, 365; 333/187
See application file for complete search history.

(56) References Cited

U.S. PATENT DOCUMENTS

| | | | |
|---|---|---|---|
| 6,812,619 B1 | 11/2004 | Kaitila et al. | |
| 6,936,837 B2 | 8/2005 | Yamada et al. | |
| 7,466,213 B2 | 12/2008 | Löbl et al. | |
| 8,008,993 B2 | 8/2011 | Milsom et al. | |
| 8,198,958 B1 | 6/2012 | Aigner et al. | |
| 2007/0254397 A1* | 11/2007 | Fattinger | H03H 3/02 438/50 |
| 2009/0045703 A1* | 2/2009 | Barber | H03H 3/02 310/364 |
| 2009/0045704 A1 | 2/2009 | Barber et al. | |
| 2009/0206706 A1 | 8/2009 | Iwaki et al. | |
| 2011/0037539 A1 | 2/2011 | Jansman et al. | |
| 2011/0080232 A1* | 4/2011 | Bar | H03H 3/02 333/187 |
| 2011/0261120 A1* | 10/2011 | Shimizu | B41J 2/161 347/71 |
| 2011/0298564 A1 | 12/2011 | Iwashita et al. | |
| 2012/0299664 A1 | 11/2012 | Hara et al. | |
| 2013/0314177 A1* | 11/2013 | Burak | H03H 9/54 333/187 |
| 2014/0118091 A1 | 5/2014 | Burak et al. | |
| 2014/0159548 A1* | 6/2014 | Burak | H03H 9/02118 310/346 |
| 2014/0175950 A1* | 6/2014 | Zou | H03H 9/173 310/365 |
| 2014/0225683 A1* | 8/2014 | Burak | H03H 9/173 333/187 |
| 2014/0273881 A1 | 9/2014 | Tajic | |

OTHER PUBLICATIONS

Final Office Action for U.S. Appl. No. 13/796,824, dated Mar. 7, 2016, 9 pages.
Non-Final Office Action for U.S. Appl. No. 13/796,824, dated Aug. 6, 2015, 16 pages.

* cited by examiner

*Primary Examiner* — Bryan Gordon
(74) *Attorney, Agent, or Firm* — Withrow & Terranova, P.L.L.C.

(57) ABSTRACT

Embodiments provide a solidly-mounted bulk acoustic wave (BAW) resonator and method of making same. In embodiments, the BAW resonator may include a planzarization portion in an inactive region of the BAW resonator that is coplanar with a piezoelectric layer of the BAW resonator in an active region of the BAW restonator. Other embodiments may be described and claimed.

21 Claims, 6 Drawing Sheets

SPURIOUS MODE SUPPRESSION IN BULK ACOUSTIC WAVE RESONATOR

FIELD

Embodiments of the present disclosure relate generally to the field of resonators, and more particularly to spurious mode resonance suppression in bulk acoustic wave (BAW) resonators.

BACKGROUND

Lateral acoustic waves, also referred to as Lamb waves, may propagate through portions of an active region of a bulk acoustic wave resonator due to finite lateral dimensions of the BAW resonator structure. This may result in part of the energy contained in a fundamental thickness mode (i.e., a vertically resonating mode) leaking to lateral modes (i.e., a horizontally resonating mode), which results in a degradation of a quality factor of the BAW resonator. Lateral acoustic waves may become evident in electrical behavior of the BAW resonator in the form of spurious resonances leading to strong ripples in the bandpass frequencies.

Performance of a BAW resonator may be improved by creating a region with specific boundary conditions in which lateral acoustic waves cannot propagate. For some resonators, this may be done by including a thickened edge load, known as a border ring (BO), in a perimeter of an active region of the BAW resonator. Presence of the thickened edge enables the mismatch between the active and inactive regions to be avoided, providing a smooth transition of propagating waves in the active region to evanescent waves in the inactive region.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

As described above, in some cases a BAW resonator may include an active region designed to resonate according to a fundamental thickness mode, which may be considered to be vertically or along a z-axis of the BAW resonator. However, in some cases the energy contained in the fundamental thickness mode may propagate through the BAW resonator as lateral acoustic waves, that is, horizontally/laterally/along an x/y-axis of the BAW resonator. This leakage may result in degradation of the quality factor of the BAW resonator. Specifically, in some cases lateral standing waves may become evident in the electrical behavior of the BAW resonator in the form of spurious resonances that may lead to strong ripples in bandpass frequencies of the BAW resonator.

In some cases, the performance of the BAW resonator can be improved by introducing a border ring or border region at the perimeter of the active region of the BAW resonator. In some cases the border region may be introduced by adding mass to a portion of the BAW resonator as described below. Alternatively, in some cases the border region may be introduced by removing mass from one or more layers of the BAW resonator within the border region, as described below. Generally, the border region may separate the active region of the BAW resonator from an inactive region of the BAW resonator. The border region may enable the mismatch between the active region and the inactive region to be avoided, providing a smooth transition of propagating waves in the active region to evanescent waves in the inactive region, thereby reducing spurious mode resonances of the BAW resonator. To do so, the lateral propagation constant $k_x$ in the active region may ideally be a real constant, while it may ideally be purely imaginary in the inactive region.

In some embodiments, a BAW resonator may show decreased amounts of spurious mode resonances in bandpass frequencies, but there may still be some amount of spurious mode resonance. Embodiments herein relate to BAW resonators with even further decrease of spurious mode resonances.

Figure 1:
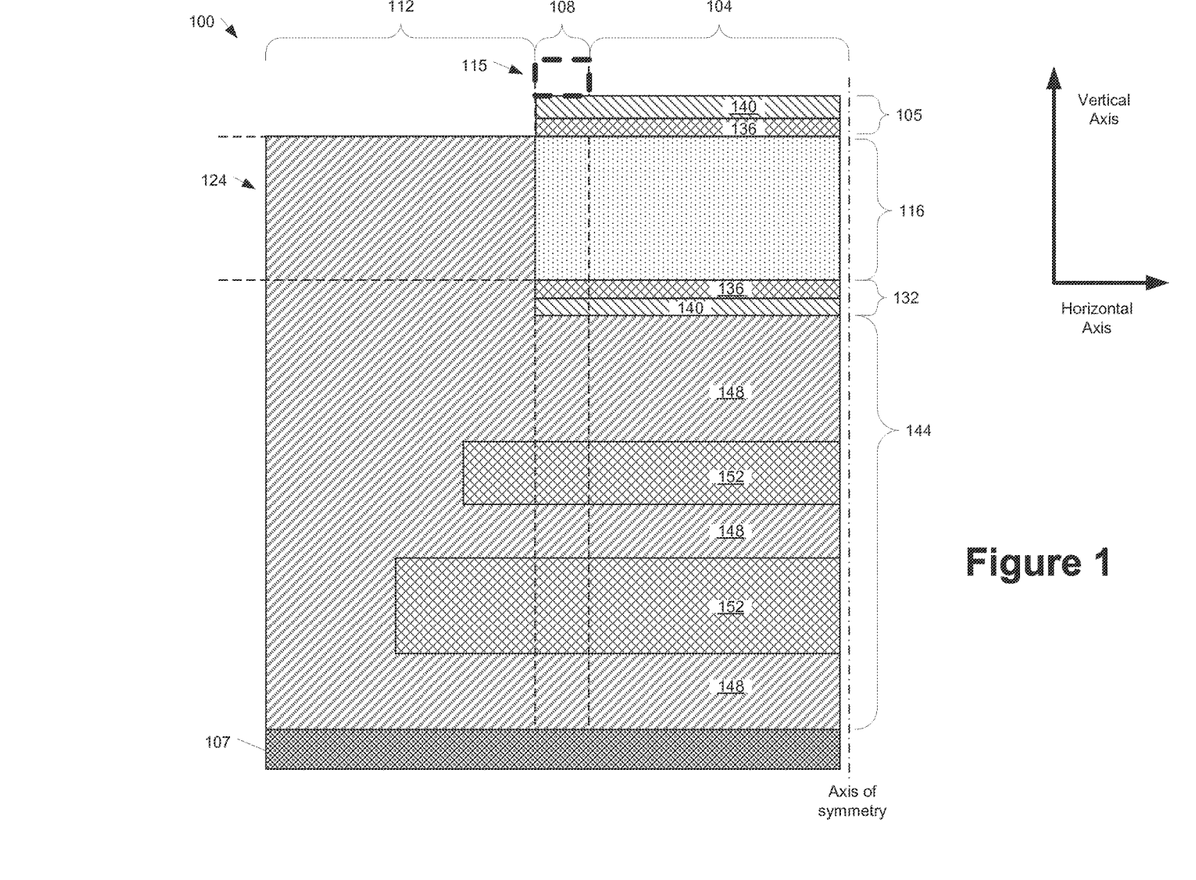
FIG. 1 illustrates a BAW resonator in accordance with some embodiments.

FIG. 1 depicts an example of a first embodiment of a BAW resonator 100 with reduced spurious mode resonance, in accordance with various embodiments. The BAW resonator 100 may be, for example, a solidly mounted BAW resonator. Elements of the BAW resonator 100 may be described with respect to a vertical axis and a horizontal axis as depicted in FIG. 1. In some embodiments, the BAW resonator 100 may include an axis of symmetry that is a generally vertical axis with respect to FIG. 1, and depicted by the line of alternating dots and dashes.

In some embodiments, the BAW resonator 100 may include planarization of a piezoelectric layer of the BAW resonator 100 with a planarization material in the inactive region, as described in further detail below. By planarizing the piezoelectric layer of the BAW resonator 100 with the planarization material, the inactive region cut-off frequency of the BAW resonator 100 may move relative to the position of the resonance frequency of the active region. The change in mechanical characteristics of the inactive region may change the decay rate of evanescent waves resulting in a smoother transition of propagating waves in the active region to evanescent waves in the inactive region. In a legacy BAW resonator, the piezoelectric layer 116 may be extended all the way into the inactive region covering the planarization portion 124.

The BAW resonator 100 may include an active region 104, a border region 108, and an inactive region 112. Generally, the active region 104 may be a part of the BAW resonator 100 that is electrically driven, and include a piezoelectric layer 116 sandwiched between a top electrode 105 and a bottom electrode 132. Specifically, the top electrode 105 and the bottom electrode 132 may drive resonance of the piezoelectric layer 116 within the active region 104 according to the fundamental thickness mode described above. The active region 104 may further include a mirror layer 144 that may also be referred to as a Bragg mirror layer in some embodiments. The active region 104 may further include a substrate layer 107.

The border region 108 may additionally include the top electrode 105, the piezoelectric layer 116, the bottom electrode 132, the mirror layer 144, and the substrate layer 107. In some embodiments the border region 108 may optionally include a mass 115 that may increase the overall mass of the BAW resonator 100 within the border region 108. In other embodiments, the border region 108 may include a portion of the top electrode 105, the piezoelectric layer 116, the bottom electrode 132, and/or the mirror layer 144 with reduced mass. Whether the mass is increased or decreased in the border region 108 may be based, for example, on the resonator dispersion type, on specific applications with which the BAW resonator 100 may be used, or one or more other factors. In general, a BAW resonator can have type I or type II dispersion, referring to the position of a longitudinal main resonance mode (TE1) and a second shear resonance mode (TS2) in the frequency domain. Generally, if the frequency at which TE1 occurs is greater than the frequency at which TS2 occurs, then the dispersion may be referred to as type I dispersion. If the frequency at which TS2 occurs is greater than the frequency at which TE1 occurs, the dispersion may be referred to as type II dispersion. Generally, the border region 108 is depicted in FIG. 1 to vertically extend through the BAW resonator 100 within the vertical dashed lines of FIG. 1.

The inactive region 112 may be the part of the BAW resonator 100 that is not electrically driven, for example, by the top electrode 105 and the bottom electrode 132. The inactive region 112 may include the substrate layer 107 and the mirror layer 144. The inactive region 112 may further include a planarization portion 124 that is generally coplanar with at least the piezoelectric layer 116 as indicated by the horizontal dashed lines in FIG. 1. That is, the planarization portion 124 may be laterally or horizontally next to the piezoelectric layer 116. In embodiments, the material of the planarization portion 124 is different from that of the piezoelectric layer 116 and it may be formed of a material that may be similar to a material of the mirror layer 144.

In some embodiments, the mass 115 may be formed of or include a dielectric material, a material similar to that used in the top electrode 105, and/or some other material.

In some embodiments, the top electrode 105 and/or the bottom electrode 132 may include one or more layers. For example, as depicted in FIG. 1, the top electrode 105 and the bottom electrode 132 include a first layer 136 and a second layer 140. The first layer 136 may be directly coupled with the piezoelectric layer 116, and the second layer 140 may be a layer of the electrode that is not directly next to the piezoelectric layer. In some embodiments the top electrode 105 and/or the bottom electrode 132 may include only a single layer, or three or more layers. The first layer 136 may include a material such as Tungsten (W). The second layer 140 may include a material such as an Aluminum Copper (AlCu) compound. Other materials may be used in other embodiments.

The piezoelectric layer 116 may include a piezoelectric material such as Aluminum Nitride (AlN) or some other piezoelectric material. The substrate layer 107 may include a dielectric material such as Silicon (Si) or some other suitable substrate material.

The mirror layer 144 may include alternating layers of a dielectric material 148, for example, Silicon Oxide ($SiO_2$), and a conductive material 152, for example, Tungsten (W). As shown in FIG. 1, the dielectric material of the reflector layer(s) 148 may be the same material as that used in the planarization portion 124. In other embodiments, a different material may be used between one or more of the reflector layer(s) 148 and/or the planarization portion 124.

As shown in FIG. 1, in some embodiments one or more of the conductive material layer(s) 152 may extend farther into the inactive region 112 than another of the conductive material layer(s) 152. For example, as depicted the bottom conductive material layer 152 (as viewed with reference to FIG. 1) may extend farther than the top conductive material layer 152 (as viewed with reference to FIG. 1). For example, the bottom conductive material layer 152 may extend farther than the top conductive material layer by 3 to 5 microns. Although three of the dielectric material layers 148 and two of the conductive material layers 152 are depicted in FIG. 1, in other embodiments a higher or lower number of dielectric material layer(s) 148 and conductive material layer(s) 152 may be used in the BAW resonator 100. Also, the thicknesses depicted in FIG. 1 are intended to be examples of one embodiment, and other embodiments of the BAW resonator 100 may have different thicknesses of the different layers and/or elements.

In some embodiments, the planarization portion 124 may further smooth the transition of the lateral propagation constant $k_x$ in the active region 104 from a real constant to an imaginary constant in the inactive region 112. By smoothing this transition, the spurious mode resonances of the BAW resonator 100 may be further reduced.

Figure 2:
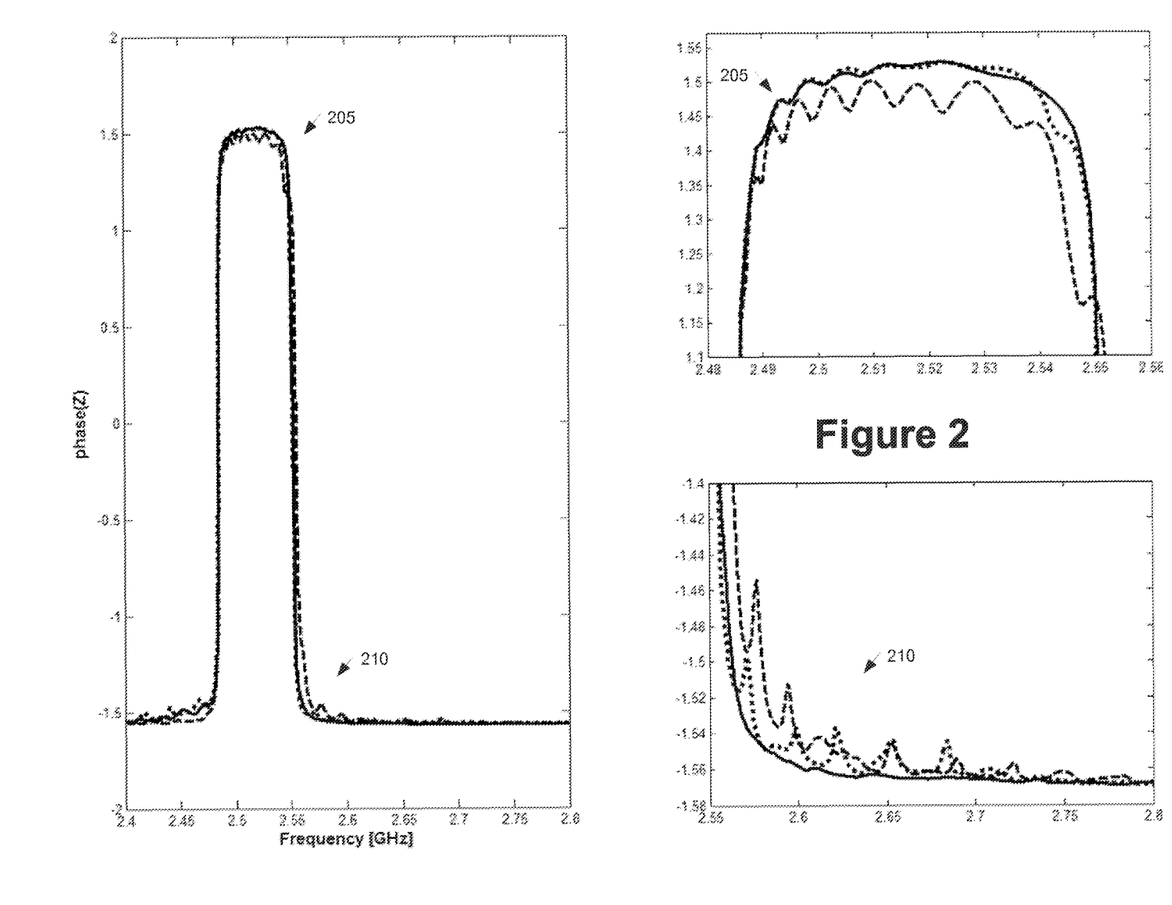
FIG. 2 is a graph illustrating BAW resonator performance in accordance with some embodiments.

FIG. 2 depicts an example of spurious mode suppression that may be achieved by planarization of the piezoelectric layer 116 with the planarization portion 124 in the inactive region 112. Specifically, FIG. 2 depicts an example of impedance phase of a BAW resonator such as BAW resonator 100 operating with a type I dispersion curve. FIG. 2 depicts an example that includes both a graphic illustrating both the bandpass portion 205 of the BAW resonator as well as a region 210 adjacent to the bandpass portion 205. FIG. 2 further depicts detailed graphics of the bandpass portion 205 and the region 210 adjacent the bandpass portion 205. The dashed line indicates a legacy BAW resonator operating without a border region 108. The dotted line indicates a legacy BAW resonator operating with a border region 108. The solid line indicates a BAW resonator such as BAW resonator 100 operating with both a border region 108 and a planarization portion 124. As can be seen in FIG. 2, the performance of the BAW resonator 100 in the bandpass region 205 may be significantly smoother than the performance of either of the legacy BAW resonators. Additionally, the performance of the BAW resonator 100 in a region 210 adjacent to the bandpass region 205 may also be significantly smoother than the performance of either of the legacy BAW resonators. As depicted in FIG. 2, the material in the piezoelectric layer 116 may be AlN (in all three cases) while the planarization material in the planarization portion 124 may be $SiO_2$.

Figure 3:
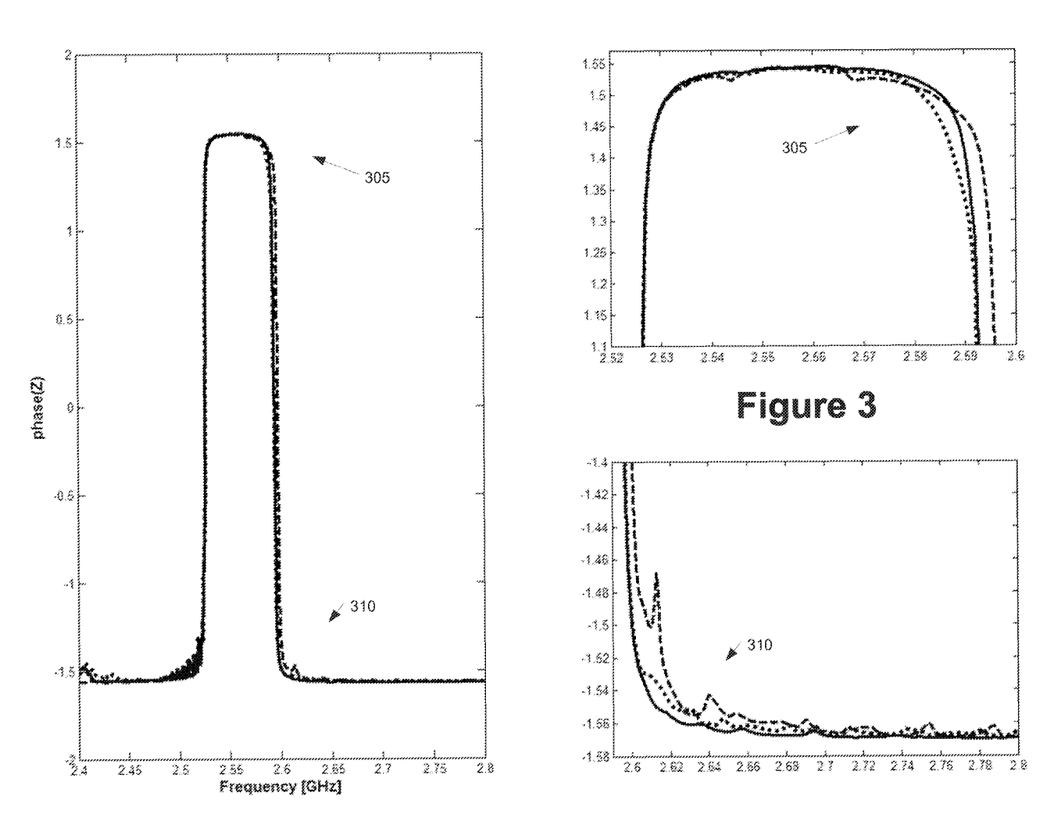
FIG. 3 illustrates a graph illustrating BAW resonator performance in accordance with some embodiments.

FIG. 3 depicts an example of spurious mode suppression that may be achieved by planarization of the piezoelectric layer 116 with the planarization portion 124 in the inactive region 112. Specifically, FIG. 3 depicts an example of impedance phase of a BAW resonator such as BAW resonator 100 operating with a type II dispersion curve. FIG. 3 depicts an example that includes both a graphic illustrating both the bandpass portion 305 of the BAW resonator as well as a region 310 adjacent to the bandpass portion 305. FIG. 3 further depicts detailed graphics of the bandpass portion 305 and the region 310 adjacent the bandpass portion 305. The dashed line indicates a legacy BAW resonator operating without a border region 108. The dotted line indicates a legacy BAW resonator operating with a border region 108. The solid line indicates a BAW resonator such as BAW resonator 100 operating with both a border region 108 and a planarization portion 124. As can be seen in FIG. 3, the performance of the BAW resonator 100 in the bandpass region 305 may be significantly smoother than the performance of either of the legacy BAW resonators. Additionally, the performance of the BAW resonator 100 in a region 310 adjacent to the bandpass region 305 may also be significantly smoother than the performance of either of the legacy BAW resonators. As depicted in FIG. 3, the material in the piezoelectric layer 116 may be AlN (in all three cases) while the planarization material in the planarization portion 124 may be $SiO_2$.

Figure 4:
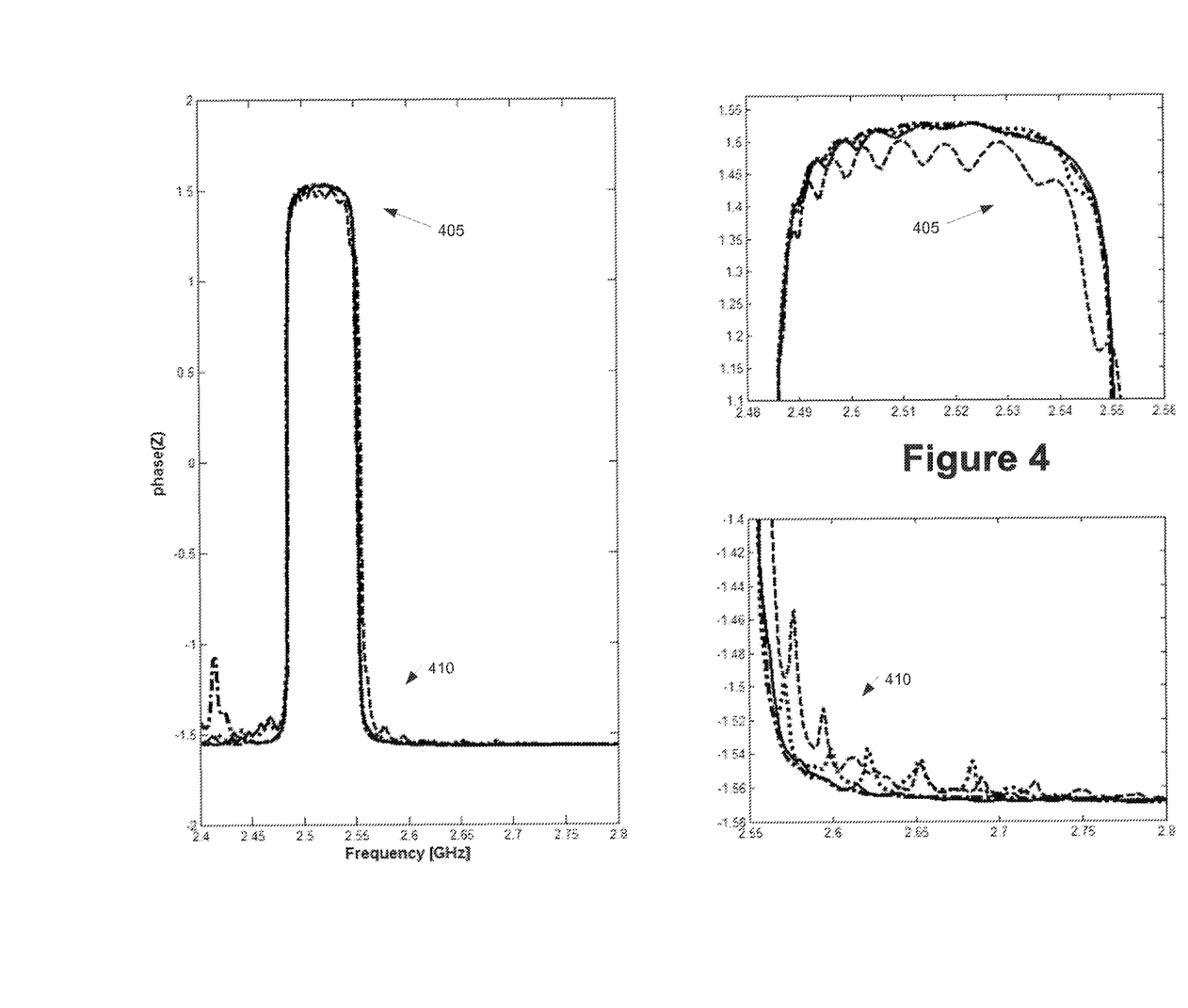
FIG. 4 illustrates a graph illustrating BAW resonator performance in accordance with some embodiments.

FIG. 4 depicts an example of spurious mode suppression that may be achieved by planarization of the piezoelectric layer 116 with the planarization portion 124 in the inactive region 112. Specifically, FIG. 4 depicts an example of impedance phase of a BAW resonator such as BAW resonator 100 operating with a type I dispersion curve. FIG. 4 depicts an example that includes both a graphic illustrating both the bandpass portion 405 of the BAW resonator as well as a region 410 adjacent to the bandpass portion 405. FIG. 4 further depicts detailed graphics of the bandpass portion 405 and the region 410 adjacent the bandpass portion 405. The dashed line indicates a legacy BAW resonator operating without a border region 108. The dotted line indicates a legacy BAW resonator operating with a border region 108. The solid line indicates a BAW resonator such as BAW resonator 100 operating with both a border region 108 and a planarization portion 124 that includes a planarization material such as SiN. The line indicated by dash-dot indicates a BAW resonator such as BAW resonator 100 operating with both a border region 108 and a planarization portion 124 that includes a planarization material such as $HfO_2$. As can be seen in FIG. 4, the performance of the BAW resonator 100 with the planarization portion 124 that includes a planarization material such as SiN and/or $HfO_2$ in the bandpass region 405 may be significantly smoother than the performance of either of the legacy BAW resonators. Additionally, the performance of the BAW resonator 100 with the planarization portion 124 that includes a planarization material such as SiN and/or $HfO_2$ in a region 410 adjacent to the bandpass region 405 may also be significantly smoother than the performance of either of the legacy BAW resonators. The material in the piezoelectric layer 116 may be AlN in all four cases.

Figure 5:
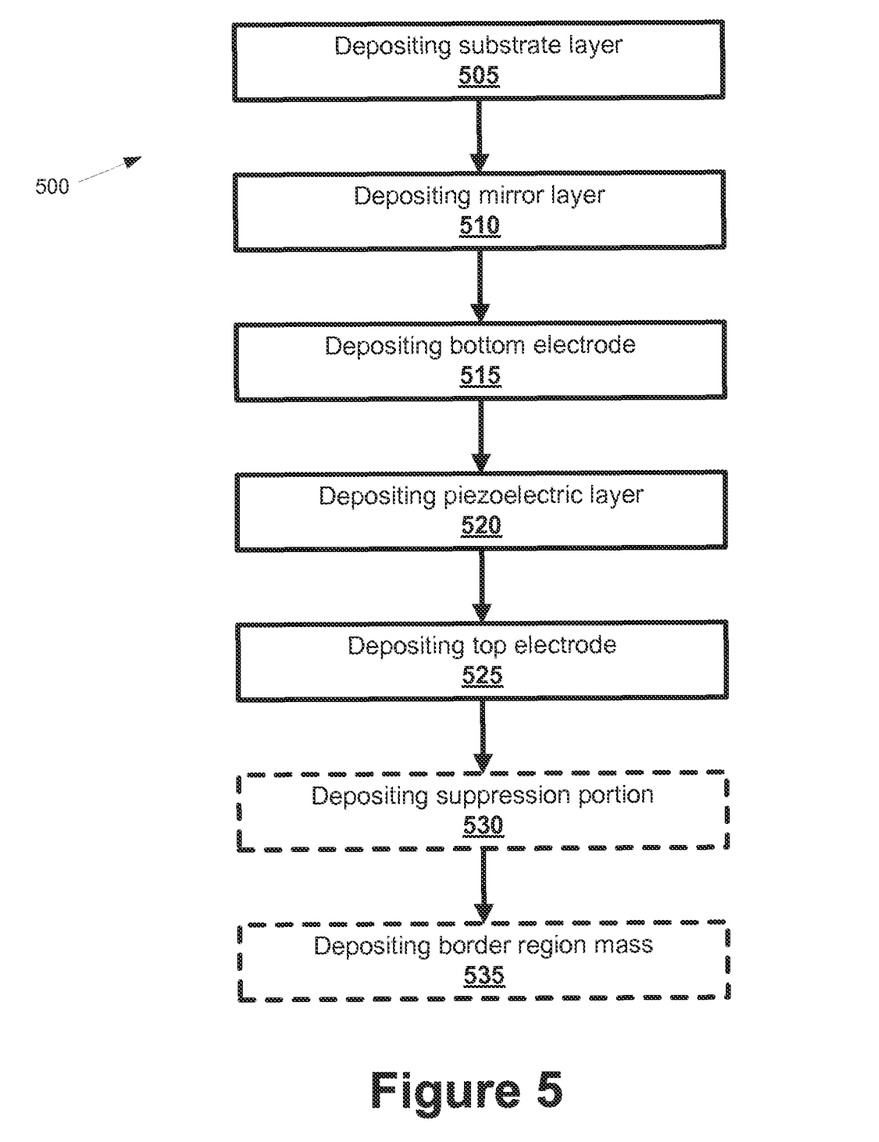
FIG. 5 is a flowchart depicting a manufacturing operation of a BAW resonator in accordance with some embodiments.

FIG. 5 depicts an example process 500 for fabricating a BAW resonator such as BAW resonator 100. Initially, a substrate layer may be deposited at 505. The substrate layer deposited at 505 may be similar, for example, to substrate layer 107. Specifically, the substrate layer may include a material such as Si.

The process 500 may include depositing a mirror layer such as mirror layer 144 at 510. The mirror layer deposited at 510 may include, for example, one or more alternating layers of a conductive material layer 152 and a dielectric material layer 148. In some embodiments, one or more of the conductive material layer(s) 152 may extend partially through an active region 104 and a border region 108 of the BAW 100, and into an inactive region 112.

The process 500 may further include depositing a bottom electrode at 515, for example, bottom electrode 132. In some embodiments the bottom electrode may include a first layer 140 that may be a material such as an AlCu compound, and a second layer 136 that may be a material such as Tungsten (W).

The process 500 may further include depositing a piezoelectric layer such as piezoelectric layer 116 at 520. The piezoelectric layer may include a piezoelectric material such as AlN.

The process 500 may further include depositing a top electrode at 525, for example, top electrode 105. The top electrode and bottom electrode may include a first layer 136 that may be a material such as Tungsten (W), and a second layer 140 that may be a material such as an AlCu compound.

In some embodiments, the process 500 may optionally include depositing a planarization portion at 530 such as planarization portion 124.

In some embodiments, the process 500 may optionally include depositing a border region mass at 535 such as mass 115. In some embodiments, the process may not include depositing the border region mass at 535 because the border region 108 may have been defined by a portion of the top electrode 105, piezoelectric layer 116, bottom electrode 132, and/or mirror layer 144 in the border region 108 that has reduced mass as compared to a portion of the same layer in the active region 104.

The process 500 is intended as only an example of one process that may be used to construct a BAW resonator such as BAW resonator 100. In other embodiments, the BAW resonator 100 may be constructed via a different process or manufacturing technique. For example, in some embodiments some elements may be performed in a different sequence than depicted in process 500. As described herein, the deposition of different layers may be performed via sputter deposition, lamination, or some other type of deposition or construction.

Although specific materials are discussed above with respect to some embodiments, in other embodiments different materials may be used. For example, the top electrode 105 and bottom electrode 132 are described as including Tungsten (W) and Aluminum-Copper (AlCu), however in other embodiments additional and/or different materials may be used in the top electrode 105 and/or bottom electrode 132. Similarly, although the piezoelectric material of piezoelectric layer 116 is described as Aluminum Nitride (AlN), in other embodiments the piezoelectric layer 116 may include additional and/or different piezoelectric materials. Similarly, although the dielectric material of the substrate layer 107 and/or the mirror layer 144 are described as Silicon (Si) and/or Silicon Oxide (SiO$_2$), in other embodiments an additional and/or different suitable dielectric material may be used. Additionally, although Tungsten (W) is described as the conductive material of the mirror layer 144, in other embodiments additional and/or different conductive materials may be used. Additionally, although the planarization portion 124 is described as including Silicon Oxide (SiO$_2$), Silicon Nitride (SiN), and/or Hafnium Oxide (HfO$_2$), in other embodiments the planarization portion 124 may include a different and/or additional planarization material.

Figure 6:
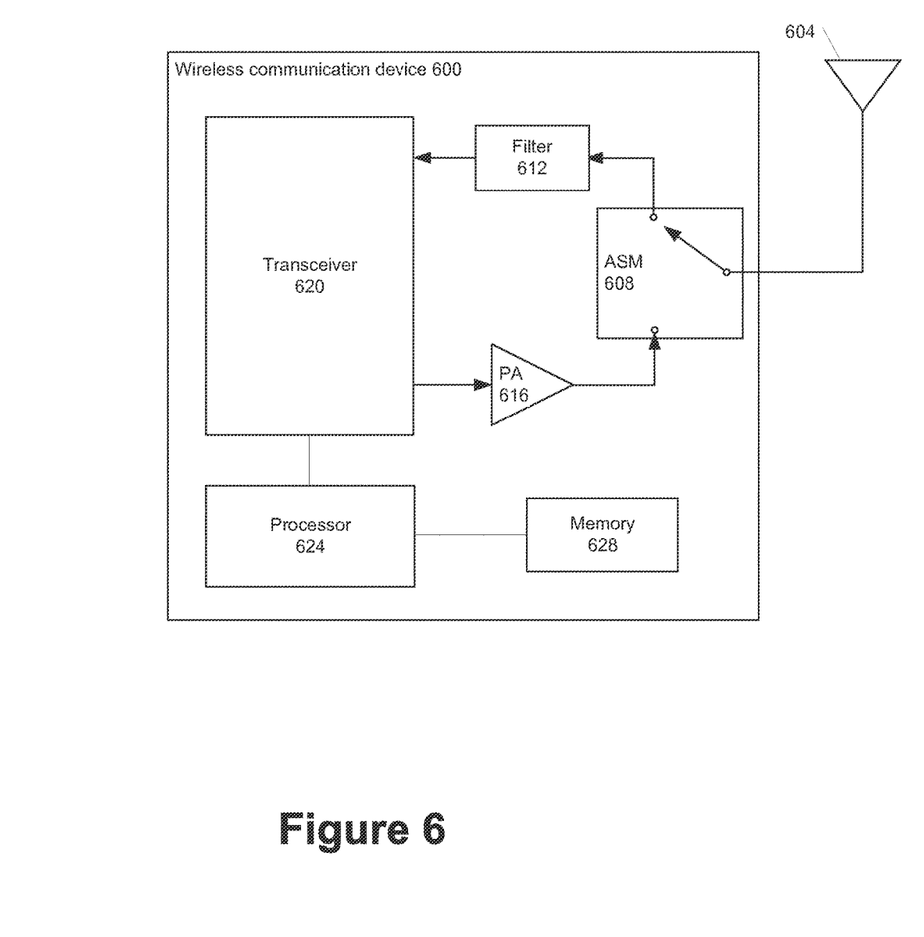
FIG. 6 illustrates a wireless communication device in accordance with some embodiments.

A wireless communication device 600 is illustrated in FIG. 6 in accordance with some embodiments. The wireless communication device 600 may have an antenna structure 604, an antenna switch module (ASM) 608, a filter 612, a power amplifier (PA) 616, a transceiver 620, a processor 624, and a memory 628 coupled with each other at least as shown.

The antenna structure 604 may include one or more antennas to transmit and receive radio frequency (RF) signals over the air. The antenna structure 604 may be coupled with the ASM 608 that operates to selectively couple the antenna structure with the filter 612 or the PA 616. When receiving incoming RF signals, the ASM 608 may couple the antenna structure 604 with the filter 612. The filter 612 may include one or more BAW resonators, such as BAW resonator 100. In some embodiments, the filter 612 may include a first plurality of series BAW resonators and a second plurality of shunt BAW resonators. The filter 612 may filter the RF signals received from the ASM 608 and pass portions of the RF signals within a predetermined bandpass to the transceiver 620.

When transmitting outgoing RF signals, the ASM 608 may couple the antenna structure 604 with the PA 616. The PA 616 may receive RF signals from the transceiver 620, amplify the RF signals, and provide the RF signals to the antenna structure 604 for over-the-air transmission.

The processor 624 may execute a basic operating system program, stored in the memory 628, in order to control the overall operation of the wireless communication device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the processor 624, may generate RF signals to represent the outgoing data, and provide the RF signals to the PA 616. Conversely, the transceiver 620 may receive RF signals from the filter 612 that represent incoming data. The transceiver 620 may process the RF signals and send incoming signals to the processor 624 for further processing.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Various example embodiments are described below.

Example 1 may include a bulk acoustic wave (BAW) resonator comprising: a border region that is located between an inactive region and an active region along a first axis; a substrate in the inactive region, border region, and active region, the substrate to include silicon (Si); a mirror layer coupled with the substrate layer, the mirror layer disposed in the inactive region, border region, and active region and including a plurality of layers of Silicon Oxide (SiO2) and a plurality of layers of Tungsten (W); a bottom electrode layer coupled with the mirror layer, the bottom electrode layer disposed in the border region and the active region and including a layer of Tungsten (W) and a layer of Aluminum-Copper (AlCu); a piezoelectric layer coupled with the bottom electrode layer, the piezoelectric layer disposed in the border region and the active region and including Aluminum Nitride (AlN); a top electrode layer coupled with the piezoelectric layer, the top electrode layer disposed in the border region and the active region and including a layer of Tungsten (W) and a layer of Aluminum-Copper (AlCu); and a planarization layer coupled with the mirror layer adjacent to the piezoelectric layer along the first axis, the planarization layer being disposed in the inactive region and including the planarization material.

Example 2 may include the BAW resonator of example 1, wherein the planarization material includes Silicon Oxide (SiO2), Silicon Nitride (SiN), or Hafnium Oxide (HfO2).

Example 3 may include the BAW resonator of examples 1 or 2, further comprising a mass layer coupled with the top electrode layer in the border region.

Example 4 may include the BAW resonator of examples 1 or 2, wherein the border region includes a portion of the piezoelectric layer, top electrode, bottom electrode layer, or mirror layer with reduced mass.

Example 5 may include a bulk acoustic wave (BAW) resonator comprising: a piezoelectric layer that includes a piezoelectric material and located between a first electrode and a second electrode in an active region and a border region of the BAW resonator; and a planarization layer that includes a planarization material that is different than the piezoelectric material and is located adjacent to the piezoelectric layer in an inactive region of the BAW resonator that is adjacent to the border region of the BAW resonator, the planarization layer to improve suppression of spurious resonances of the BAW resonator.

Example 6 may include the BAW resonator of example 5, wherein the planarization material includes Silicon Oxide (SiO2), Silicon Nitride (SiN), or Hafnium Oxide (HfO2).

Example 7 may include the BAW resonator of example 5, wherein the piezoelectric material includes Aluminum Nitride (AlN).

Example 8 may include the BAW resonator of any of examples 5-7, wherein the second electrode is a bottom electrode that is coupled with a mirror layer.

Example 9 may include the BAW resonator of example 8, wherein the mirror layer is a Bragg mirror layer.

Example 10 may include the BAW resonator of example 8, wherein the mirror layer includes one or more layers of a conductive material and one or more layers of a dielectric material.

Example 11 may include the BAW resonator of any of examples 5-7, wherein the border region includes a mass layer coupled with the first electrode in the border region on a side of the first electrode opposite the piezoelectric layer.

Example 12 may include the BAW resonator of any of examples 5-7, wherein the border region includes a portion of the piezoelectric layer, first electrode, second electrode, or mirror layer.

Example 13 may include the BAW resonator of any of examples 5-7, wherein the first electrode or the second electrode include an Aluminum-Copper (AlCu) layer and a Tungsten (W) layer.

Example 14 may include a bulk acoustic wave (BAW) resonator comprising: an active region that is coupled with and adjacent to a border region along a first axis; an inactive region that is coupled with and adjacent to the border region on a side of the border region opposite the active region; a piezoelectric layer located between a top electrode and a bottom electrode along a second axis that is perpendicular to the first axis in the active region and the border region; a mirror layer coupled with the piezoelectric layer along the second axis; and a planarization layer that is adjacent to and coupled with the piezoelectric layer along the first axis in the inactive region.

Example 15 may include the BAW resonator of example 14, wherein the mirror layer includes Silicon Oxide (SiO2).

Example 16 may include the BAW resonator of example 14, wherein the mirror layer includes one or more layers of Silicon Oxide (SiO2) and one or more layers of Tungsten (W).

Example 17 may include the BAW resonator of any of examples 14-16, wherein the piezoelectric layer includes Aluminum Nitride (AlN).

Example 18 may include the BAW resonator of any of examples 14-16, wherein the border region includes a mass layer coupled with the top electrode in the border region on a side of the top electrode opposite the piezoelectric layer.

Example 19 may include the BAW resonator of any of examples 14-16, wherein the border region includes a portion of the piezoelectric layer, top electrode, bottom electrode, or mirror layer with reduced mass.

Example 20 may include the BAW resonator of any of examples 14-16, wherein the top electrode or the bottom electrode include an Aluminum-Copper (AlCu) layer and a Tungsten (W) layer.

Example 21 may include the BAW resonator of any of examples 14-16, wherein the planarization material includes Silicon Oxide (SiO2), Silicon Nitride (SiN), or Hafnium Oxide (HfO2).

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A bulk acoustic wave (BAW) resonator comprising:
    a border region that is located between an inactive region and an active region, the border region, the inactive region, and the active region intersecting a first axis;
    a substrate in the inactive region, border region, and active region, the substrate to include silicon (Si), the substrate parallel to the first axis;
    a mirror layer coupled with the substrate, the mirror layer disposed in the inactive region, border region, and active region and including a plurality of layers of Silicon Oxide (SiO2) and a plurality of layers of Tungsten (W);
    a bottom electrode layer coupled with the mirror layer, the bottom electrode layer disposed in the border region and the active region and including a layer of Tungsten (W) and a layer of Aluminum-Copper (AlCu);
    a piezoelectric layer coupled with the bottom electrode layer, the piezoelectric layer disposed in the border region and the active region and including Aluminum Nitride (AlN);
    a top electrode layer coupled with the piezoelectric layer, the top electrode layer disposed in the border region and the active region and including a layer of Tungsten (W) and a layer of Aluminum-Copper (AlCu); and
    a planarization layer coupled with the mirror layer, the planarization layer adjacent to the piezoelectric layer, the planarization layer and the piezoelectric layer intersecting the first axis, the planarization layer being disposed in the inactive region and including a planarization material.

2. The BAW resonator of claim 1, wherein the planarization material includes Silicon Oxide ($SiO_2$), Silicon Nitride (SiN), or Hafnium Oxide ($HfO_2$).

3. The BAW resonator of claim 1, further comprising a mass layer coupled with the top electrode layer in the border region.

4. The BAW resonator of claim 1, wherein the border region includes a portion of the piezoelectric layer, top electrode, bottom electrode layer, or mirror layer with reduced mass.

5. A bulk acoustic wave (BAW) resonator comprising:
    a piezoelectric layer that includes a piezoelectric material and vertically located between a first electrode and a second electrode in an active region and a border region of the BAW resonator; and
    a planarization layer that includes a planarization material that is different than the piezoelectric material and is located horizontally adjacent to the piezoelectric layer in an inactive region of the BAW resonator that is horizontally adjacent to the border region of the BAW resonator, the planarization layer to improve suppression of spurious resonances of the BAW resonator.

6. The BAW resonator of claim 5, wherein the planarization material includes Silicon Oxide ($SiO_2$), Silicon Nitride (SiN), or Hafnium Oxide ($HfO_2$).

7. The BAW resonator of claim 5, wherein the piezoelectric material includes Aluminum Nitride (AlN).

8. The BAW resonator of claim 5, wherein the second electrode is a bottom electrode that is coupled with a mirror layer.

9. The BAW resonator of claim 8, wherein the mirror layer is a Bragg mirror layer.

10. The BAW resonator of claim 8, wherein the mirror layer includes one or more layers of a conductive material and one or more layers of a dielectric material.

11. The BAW resonator of claim 5, wherein the border region includes a mass layer coupled with the first electrode in the border region on a side of the first electrode opposite the piezoelectric layer.

12. The BAW resonator of claim 5, wherein the border region includes a portion of the piezoelectric layer, first electrode, second electrode, or mirror layer.

13. The BAW resonator of claim 5, wherein the first electrode or the second electrode include an Aluminum-Copper (AlCu) layer and a Tungsten (W) layer.

14. A bulk acoustic wave (BAW) resonator comprising:
an active region that is coupled with and adjacent to a border region, the active region and the border region intersecting a first axis;
an inactive region that is coupled with and adjacent to the border region on a side of the border region opposite the active region;
a piezoelectric layer located between a top electrode and a bottom electrode, the piezoelectric layer, the top electrode, and the bottom electrode intersecting a second axis that is perpendicular to the first axis in the active region and the border region;
a mirror layer coupled with the piezoelectric layer, the mirror layer perpendicular to and intersecting the second axis; and
a planarization layer in the inactive region that is adjacent to and coupled with the piezoelectric layer, the planarization layer and the piezoelectric layer intersecting the first axis.

15. The BAW resonator of claim 14, wherein the mirror layer includes Silicon Oxide ($SiO_2$).

16. The BAW resonator of claim 14, wherein the mirror layer includes one or more layers of Silicon Oxide ($SiO_2$) and one or more layers of Tungsten (W).

17. The BAW resonator of claim 14, wherein the piezoelectric layer includes Aluminum Nitride (AlN).

18. The BAW resonator of claim 14, wherein the border region includes a mass layer coupled with the top electrode in the border region on a side of the top electrode opposite the piezoelectric layer.

19. The BAW resonator of claim 14, wherein the border region includes a portion of the piezoelectric layer, top electrode, bottom electrode, or mirror layer with reduced mass.

20. The BAW resonator of claim 14, wherein the top electrode or the bottom electrode include an Aluminum-Copper (AlCu) layer and a Tungsten (W) layer.

21. The BAW resonator of claim 14, wherein the planarization material includes Silicon Oxide ($SiO_2$), Silicon Nitride (SiN), or Hafnium Oxide ($HfO_2$).

* * * * *